(12) United States Patent  
Luo et al.

(10) Patent No.: US 11,798,958 B2
(45) Date of Patent: Oct. 24, 2023

(54) DRIVING BACKPLANE, MANUFACTURING METHOD THEREOF, AND DISPLAY APPARATUS

(71) Applicants: BEIJING BOE DISPLAY TECHNOLOGY CO., LTD., Beijing (CN); BOE TECHNOLOGY GROUP CO., LTD., Beijing (CN)

(72) Inventors: Wenqian Luo, Beijing (CN); Xiang Li, Beijing (CN); Zhanchang Bu, Beijing (CN)

(73) Assignees: BEIJING BOE DISPLAY TECHNOLOGY CO., LTD., Beijing (CN); BOE TECHNOLOGY GROUP CO., LTD, Beijing (CN)

( * ) Notice: Subject to any disclaimer, the term of this patent is extended or adjusted under 35 U.S.C. 154(b) by 541 days.

(21) Appl. No.: 17/059,501

(22) PCT Filed: Mar. 11, 2020

(86) PCT No.: PCT/CN2020/078787
§ 371 (c)(1),
(2) Date: Nov. 30, 2020

(87) PCT Pub. No.: WO2020/187107
PCT Pub. Date: Sep. 24, 2020

(65) Prior Publication Data
US 2021/0225901 A1    Jul. 22, 2021

(30) Foreign Application Priority Data
Mar. 20, 2019  (CN) .......................... 201910212297.0

(51) Int. Cl.
*H01L 23/00*  (2006.01)
*H01L 27/12*  (2006.01)
(Continued)

(52) U.S. Cl.
CPC ........ *H01L 27/1266* (2013.01); *H01L 25/167* (2013.01); *H01L 33/62* (2013.01)

(58) Field of Classification Search
CPC .... H01L 27/1266; H01L 25/167; H01L 33/62
See application file for complete search history.

(56) References Cited

U.S. PATENT DOCUMENTS 9,871,062 B2   1/2018  Im et al.
2020/0161570 A1   5/2020  Bai et al.

FOREIGN PATENT DOCUMENTS

CN           103086320         5/2013
CN           105679788         6/2016
(Continued)

OTHER PUBLICATIONS

PCT International Search Report (w/ English translation) for corresponding PCT Application No. PCT/CN2020/078787, dated Jun. 3, 2020, 5 pages.

(Continued)

*Primary Examiner* — Anthony Ho
(74) *Attorney, Agent, or Firm* — Dority & Manning, P.A.

(57) ABSTRACT

The manufacturing method of the driving backplane includes following steps. A first flexible base is formed on a surface of a rigid substrate. At least one type of conductive pattern is formed on a surface of the first flexible base. At least one type of first via is provided in the rigid substrate. At least one type of second via is provided in the first flexible base by using the rigid substrate as a mask and a conductive pillar is formed in the at least one type of second via, so that the conductive pillars are connected to respective types of conductive pattern in one-to-one correspondence. At least one type of driving chip is correspondingly bonded to the conductive pillar formed in the at least one type of second (Continued)

via from a side of the first flexible base away from the at least one type of conductive pattern.

11 Claims, 7 Drawing Sheets

(51) Int. Cl.
*H01L 25/16* (2023.01)
*H01L 33/62* (2010.01)

(56) References Cited

FOREIGN PATENT DOCUMENTS

| | | |
|---|---|---|
| CN | 105789225 | 7/2016 |
| CN | 106206432 | 12/2016 |
| CN | 106409796 | 2/2017 |
| CN | 107256870 | 10/2017 |
| CN | 107945683 | 4/2018 |
| CN | 109103166 | 12/2018 |
| CN | 109300848 | 2/2019 |
| CN | 109904080 | 6/2019 |

OTHER PUBLICATIONS

Chinese First Office Action (w/ English translation) for corresponding CN Application No. 201910212297.0, 13 pages.

DRIVING BACKPLANE, MANUFACTURING METHOD THEREOF, AND DISPLAY APPARATUS

CROSS-REFERENCE TO RELATED APPLICATION

This application is a national phase entry under 35 USC 371 of International Patent Application No. PCT/CN2020/078787 filed on Mar. 11, 2020, which claims priority to Chinese Patent Application No. 201910212297.0, filed on Mar. 20, 2019, titled "Driving Backplane, Manufacturing Method thereof, and Display Apparatus", which are incorporated herein by reference in their entirety.

TECHNICAL FIELD

The present disclosure relates to the field of display technologies, and in particular, to a driving backplane, a manufacturing method thereof, and a display apparatus.

BACKGROUND

Micro-Light Emitting Diode (Micro-LED) display technology is a technology that uses mass transfer technology to transfer micron-level Micro-LEDs to a drive substrate to realize displays of various sizes. Since displays adopting the Micro-LED technology have many advantages such as self-luminescence, high brightness, high contrast, ultra-high resolution and color saturation, long service life, quick response, and high energy efficiency, Micro-LED display technology can be applied to various sizes of displays.

SUMMARY

In an aspect, a manufacturing method of a driving backplane is provided. The manufacturing method of the driving backplane includes following steps. A rigid substrate is provided. A first flexible base is formed on a surface of the rigid substrate. At least one type of conductive pattern is formed on a surface of the first flexible base away from the rigid substrate, the at least one type of conductive pattern being configured to transmit a driving signal. At least one type of first via is provided in the rigid substrate. At least one type of second via is provided in the first flexible base by using the rigid substrate as a mask, and a conductive pillar is formed in the at least one type of second via, so that the conductive pillar formed in the at least one type of second via is connected to the at least one type of conductive pattern in one-to-one correspondence. At least one type of driving chip is correspondingly bonded to the conductive pillar formed in the at least one type of second via from a side of the first flexible base away from the at least one type of conductive pattern.

In some embodiments, after the conductive pillar is formed in the at least one type of second via and before the at least one type of driving chip is correspondingly bonded to the conductive pillar formed in the at least one type of second via, the manufacturing method of the driving backplane further includes a step in which the rigid substrate is removed from the first flexible base.

In some embodiments, before the first flexible base is formed on the surface of the rigid substrate, the manufacturing method of the driving backplane further includes a step in which the rigid substrate is modified so that the rigid substrate includes at least one type of modified region. Providing the at least one type of first via in the rigid substrate further includes a step in which the at least one type of first via is correspondingly provided in the at least one type of modified region, so that an orthographic projection of an area occupied by the at least one type of first via on the first flexible base is located within an orthographic projection of the at least one type of conductive pattern on the first flexible base in one-to-one correspondence.

In some embodiments, the at least one type of conductive pattern includes a first type of conductive pattern, a second type of conductive pattern, and a third type of conductive pattern. After the at least one type of conductive pattern is formed on the surface of the first flexible base away from the rigid substrate, and before the at least one type of first via is provided in the rigid substrate, the manufacturing method of the driving backplane further includes following steps. A thin film transistor (TFT) array and a common lead are formed on a side of the first flexible base away from the rigid substrate, so that a first type of electrode included in the TFT array is correspondingly connected to the first type of conductive pattern, a second type of electrode included in the TFT array is correspondingly connected to the second type of conductive pattern, and the common lead is correspondingly connected to the third type of conductive pattern. A light emitting device (LED) array is formed on a side of the TFT array away from the rigid substrate, so that a common electrode included in the LED array is connected to the common lead, and a driving electrode included in the LED array is connected to a third type of electrode included in the TFT array.

In some embodiments, after the LED array is formed on the side of the TFT away from the rigid substrate, and before the at least one type of first via is provided in the rigid substrate, the manufacturing method of the driving backplane further includes a step in which a backplane protective layer is formed on a surface of the LED array away from the rigid substrate. In some embodiments, after the at least one type of driving chip is correspondingly bonded to the conductive pillar(s) formed in the at least one type of second via, the manufacturing method of the driving backplane further includes a step in which the backplane protective layer is removed from the surface of the LED array away from the rigid substrate.

In some embodiments, after the TFT array and the common lead are formed on the surface of the first flexible base, and before the LED array is formed on the side of the TFT array away from the rigid substrate, the manufacturing method of the driving backplane further includes following steps. A planarization layer is formed on a surface of the TFT array away from the rigid substrate, so that the planarization layer is located on surfaces of the second type of electrode and the third type of electrode away from the rigid substrate. A first type of bonding layer and a second type of bonding layer that are insulated from each other are formed on a surface of the planarization layer away from the rigid substrate, so that the first type of bonding layer is electrically connected to the third type of electrode, and the second type of bonding layer is electrically connected to the common lead. Forming the LED array on the side of the TFT array away from the rigid substrate includes a step in which the LED array is formed on the surfaces of the first type of bonding layer and the second type of bonding layer away from the rigid substrate, so that the first type of bonding layer is connected to the driving electrode, and the second type of bonding layer is connected to the common electrode.

In some embodiments, forming the first type of bonding layer and the second type of bonding layer that are insulated from each other on the surface of the planarization layer away from the rigid substrate includes following steps. A bonding forming layer is formed on the surface of the planarization layer away from the rigid substrate. The bonding forming layer is patterned to obtain the first type of bonding layer and the second type of bonding layer, with an insulating gap between the first type of bonding layer and the second type of bonding layer. A bonding insulating layer is formed at least in the insulating gap, so that the first type of bonding layer and the second type of bonding layer are insulated from each other.

In some embodiments, after the at least one type of conductive pattern is formed on the surface of the first flexible base away from the rigid substrate, and before the at least one type of first via is provided in the rigid substrate, the manufacturing method of the driving backplane further includes following steps. A second flexible base is formed on the surface of the first flexible base away from the rigid substrate, so that the at least one type of conductive pattern is located between the first flexible base and the second flexible base. A buffer layer is formed on a surface of the second flexible base away from the rigid substrate.

In some embodiments, the first type of electrode is a gate, the second type of electrode is a source, and the third type of electrode is a drain; or, the first type of electrode is a gate, the second type of electrode is a drain, and the third type of electrode is a source.

In another aspect, a driving backplane is provided. The driving backplane is manufactured by using the manufacturing method of the driving backplane as described above.

In yet another aspect, a display apparatus is provided. The display apparatus includes the driving backplane as described above.

BRIEF DESCRIPTION OF THE DRAWINGS

In order to describe technical solutions in embodiments of the present disclosure more clearly, accompanying drawings to be used in the description of the embodiments will be introduced briefly. Obviously, the accompanying drawings to be described below are merely some embodiments of the present disclosure, and a person of ordinary skill in the art can obtain other drawings according to these drawings without paying any creative effort.

DETAILED DESCRIPTION

Figure 1:
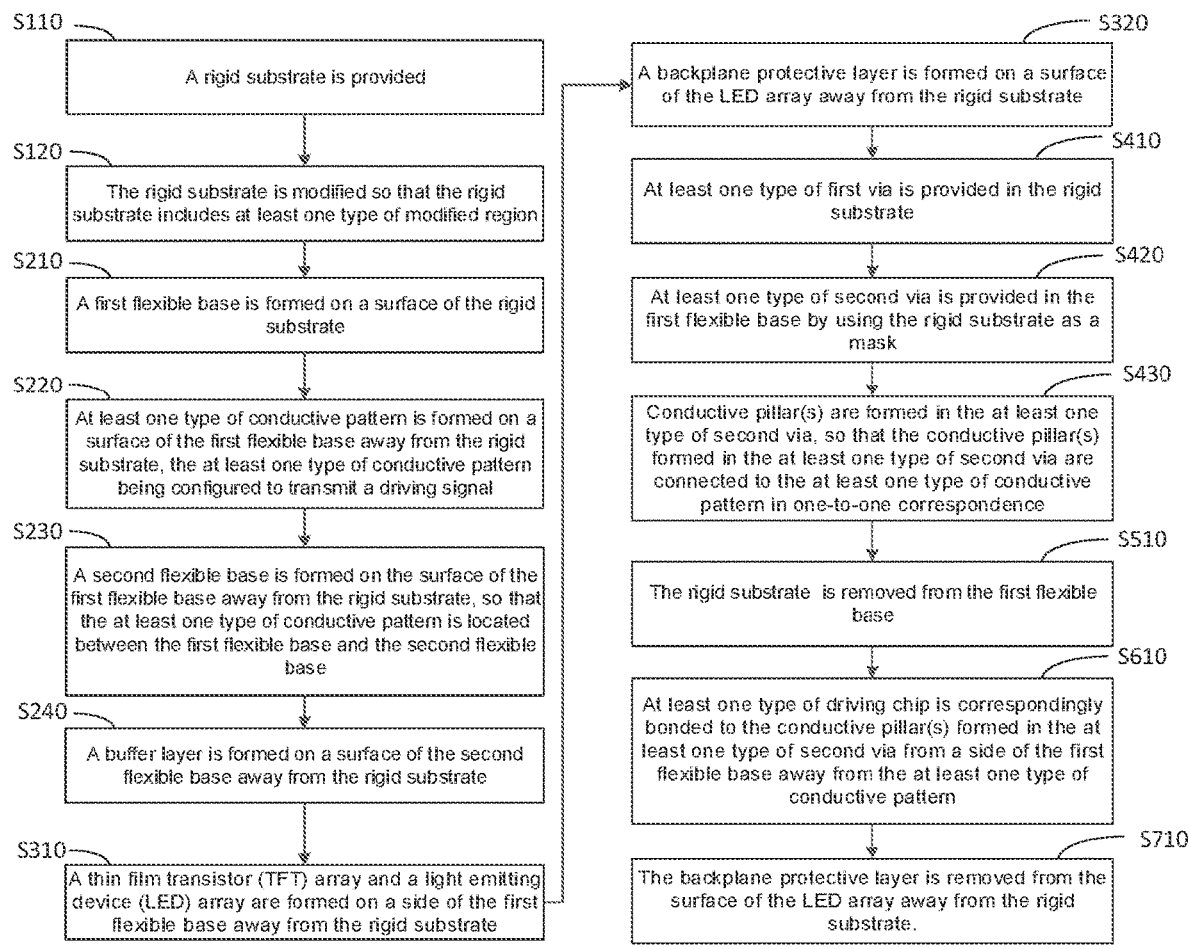
FIG. 1 is a flowchart of a manufacturing method of a driving backplane, according to some embodiments of the present disclosure.
Figure 2:
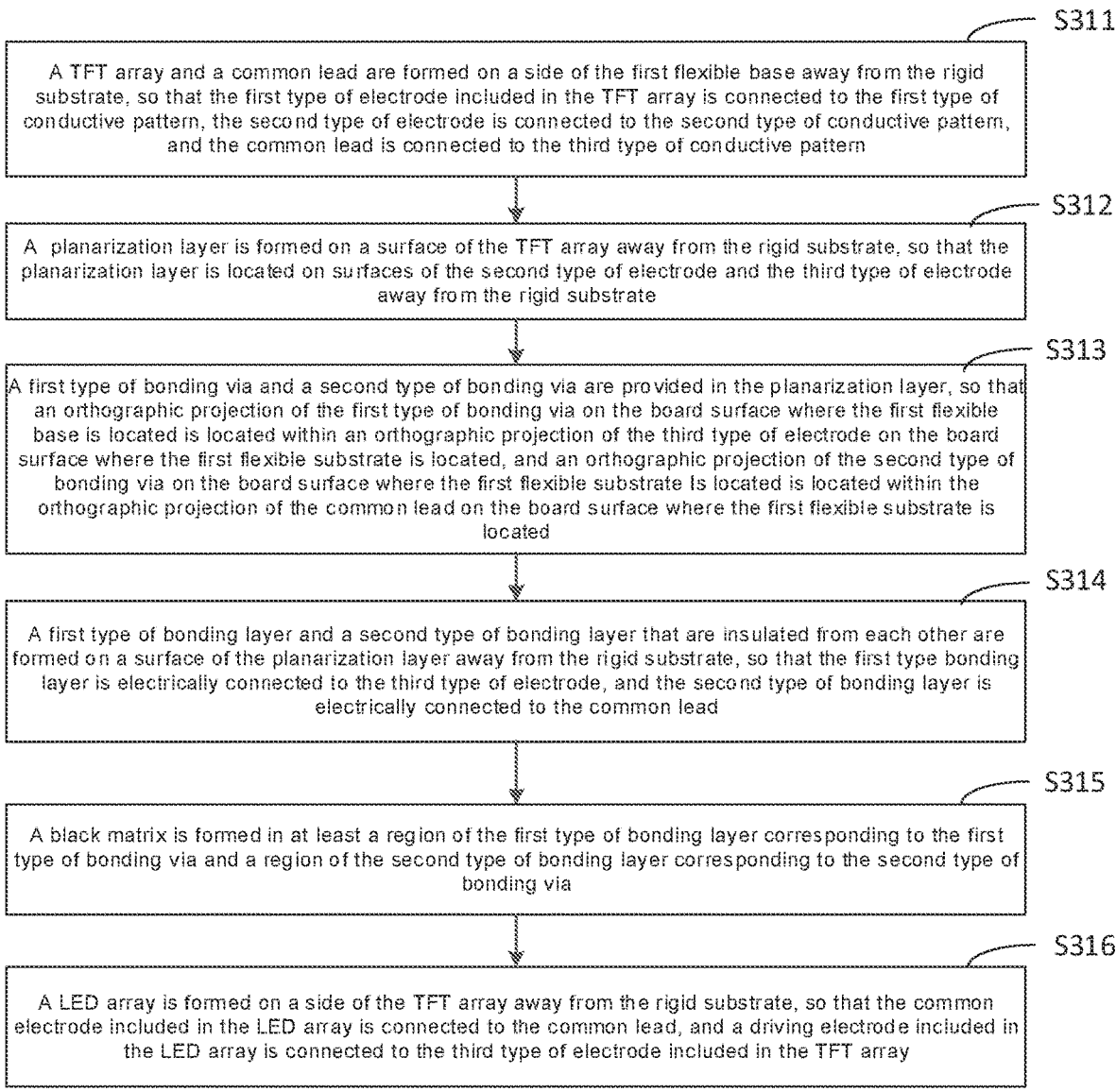
FIG. 2 is a flowchart of another manufacturing method of a driving backplane, according to some embodiments of the present disclosure.
Figure 3:
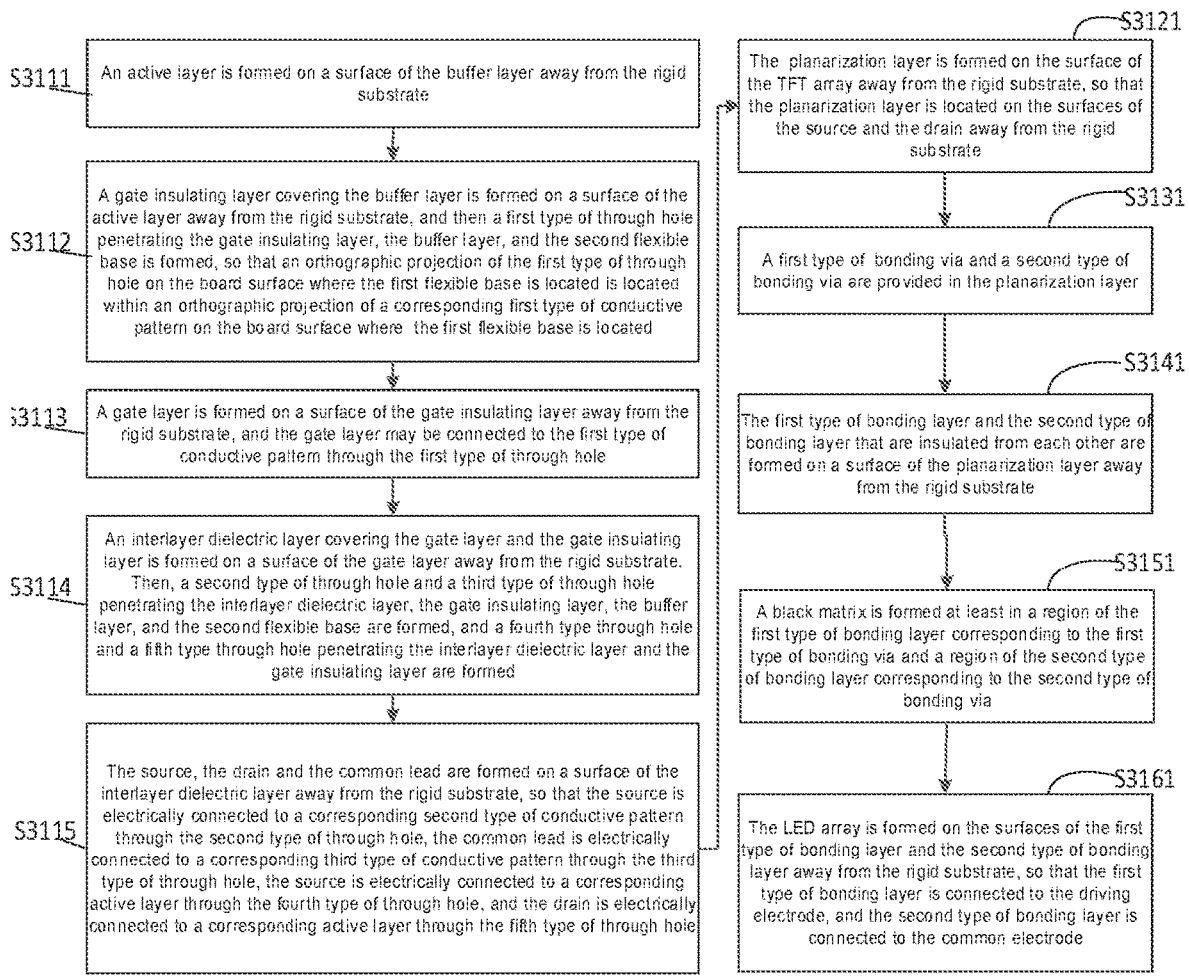
FIG. 3 is a flowchart of yet another manufacturing method of a driving backplane, according to some embodiments of the present disclosure.
Figure 4:
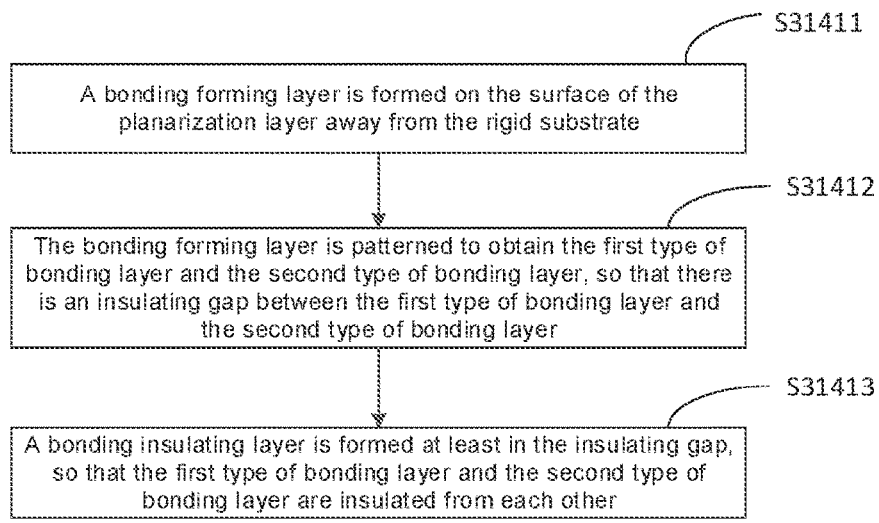
FIG. 4 is a flowchart of yet another manufacturing method of a driving backplane, according to some embodiments of the present disclosure.

Technical solutions in embodiments of the present disclosure will be described clearly and completely in combination with accompanying drawings in the embodiments of the present disclosure. However, the described embodiments are merely some but not all embodiments of the present disclosure. All other embodiments obtained based on the embodiments of the present disclosure by a person of ordinary skill in the art without paying any creative effort shall be included in the protection scope of the present disclosure.

At present, since Micro-LEDs have many advantages such as self-luminescence, high brightness, high contrast, ultra-high resolution and color saturation, long service life, quick response, high energy efficiency and adaptability to a wide range of environments, Micro-LED display technology can be widely used in micro displays such as AR/VR, medium-sized displays such as mobile TVs, large-screen displays such as movie theaters, and many other fields.

As a thin-film product of light emitting diodes, micron-level Micro-LEDs can be reduced in size to below 100 μm, for example, 1% of a size of ordinary light emitting diodes. The micro Micro-LEDs transferred to a driving backplane by using mass transfer technology are usually arranged in a pixel array, so that a pixel corresponding to each Micro-LED can be addressed and driven individually to emit light, and a distance between two adjacent Micro-LED pixels can be reduced from a conventional millimeter level to the micron level.

In a manufacturing process of a Micro-LED display, each micro light emitting device is transferred to the driving backplane after being individually encapsulated. The driving backplane includes a backplane and a driving chip bonded to a back side of the backplane. By bonding the driving chip to a surface of the backplane away from the micro light emitting device (that is, the back side of the backplane), it is possible to make a display adopting the Micro-LED technology bezel-less. As such, in manufacturing the driving backplane, a TPI (though PI via) process is used to provide a plurality of vias in a flexible base included in the backplane first; then, a conductive copper pillar is formed in each via; next, a thin film transistor (TFT) array and a light emitting device (LED) array are fabricated on a side of the flexible base; and finally, the driving chip is connected to a corresponding conductive copper pillar.

There are many methods for forming the conductive copper pillar.

For example, the conductive copper pillar is formed in the via by using a magnetron sputtering technology. Since a thickness of the flexible base is generally 10 μm (that is, a height of the conductive copper pillar should be 10 μm), and a thickness of a copper layer formed each time by using the magnetron sputtering technology is only 1 μm, the conductive copper pillar can only be obtained by using the magnetron sputtering technology to form the copper layer in the via for several times. However, if the magnetron sputtering technology is used for many times, an internal stress in a glass substrate carrying the flexible base is prone to exceed a certain threshold, which will cause the glass substrate carrying the flexible base to break.

For example, the conductive copper pillar is formed in the via by using an electroplating process. However, in this process, the copper is not only electroplated in the via, but also easily electroplated on a surface of the flexible base. Consequently, a chemical mechanical polishing (CMP) process needs to be used to polish the flexible base to remove the copper electroplated on the surface of the flexible base, which will cause serious damage to the surface of the flexible base.

On this basis, referring to FIG. 1, 5 to 8, a manufacturing method of the driving backplane provided in embodiments of the present disclosure includes S110~S610.

Figure 5:
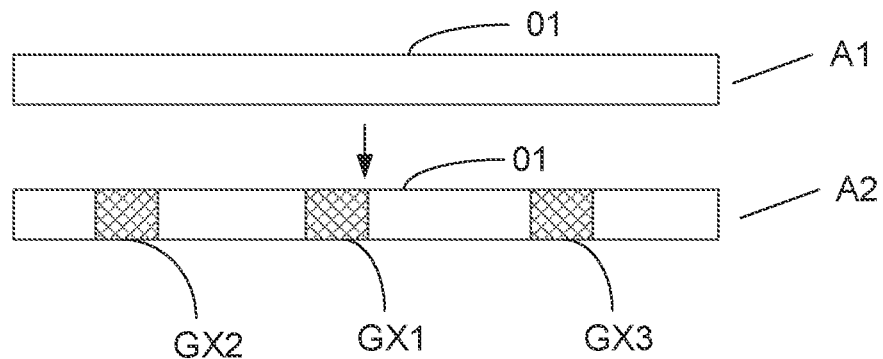
FIG. 5 is a diagram showing a process of a manufacturing method of a driving backplane, according to some embodiments of the present disclosure.

In S110, a rigid substrate 01 is provided, for example, as shown in A1 in FIG. 5.

Herein, the rigid substrate 01 refers to a substrate having a hardness that meets a certain threshold compared with a flexible substrate, and the threshold can be set according to actual needs.

For example, the rigid substrate 01 is a quartz substrate, a glass substrate, etc.

Figure 6:
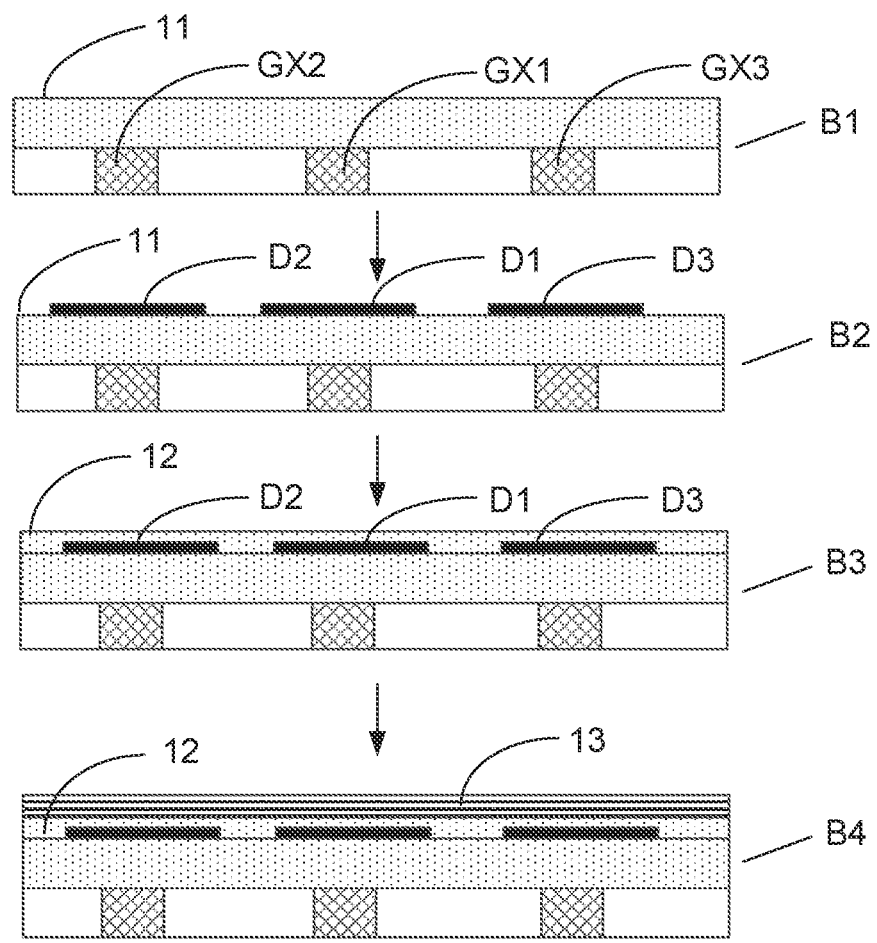
FIG. 6 is a diagram showing a process of another manufacturing method of a driving backplane, according to some embodiments of the present disclosure.

In S210, a first flexible base is formed on a surface of the rigid substrate 01, for example, as shown in B1 in FIG. 6.

In this way, the rigid substrate 01 is used to carry the first flexible base 11, which facilitates a subsequent process of fabricating the driving backplane. The first flexible base 11 may be of various types of materials, and is generally of an organic material such as polyimide.

In S220, at least one type of conductive pattern is formed on a surface of the first flexible base 11 away from the rigid substrate 01, the at least one type of conductive pattern being configured to transmit a driving signal, for example, as shown in B2 in FIG. 6.

Herein, a type of the conductive pattern is divided according to a type of the driving signal that it transmits. That is, each type of conductive pattern is used to transmit one type of driving signal, which can be a scan signal, a data signal, or a common signal.

The number of conductive patterns for each type may be set according to actual conditions.

Figure 8:
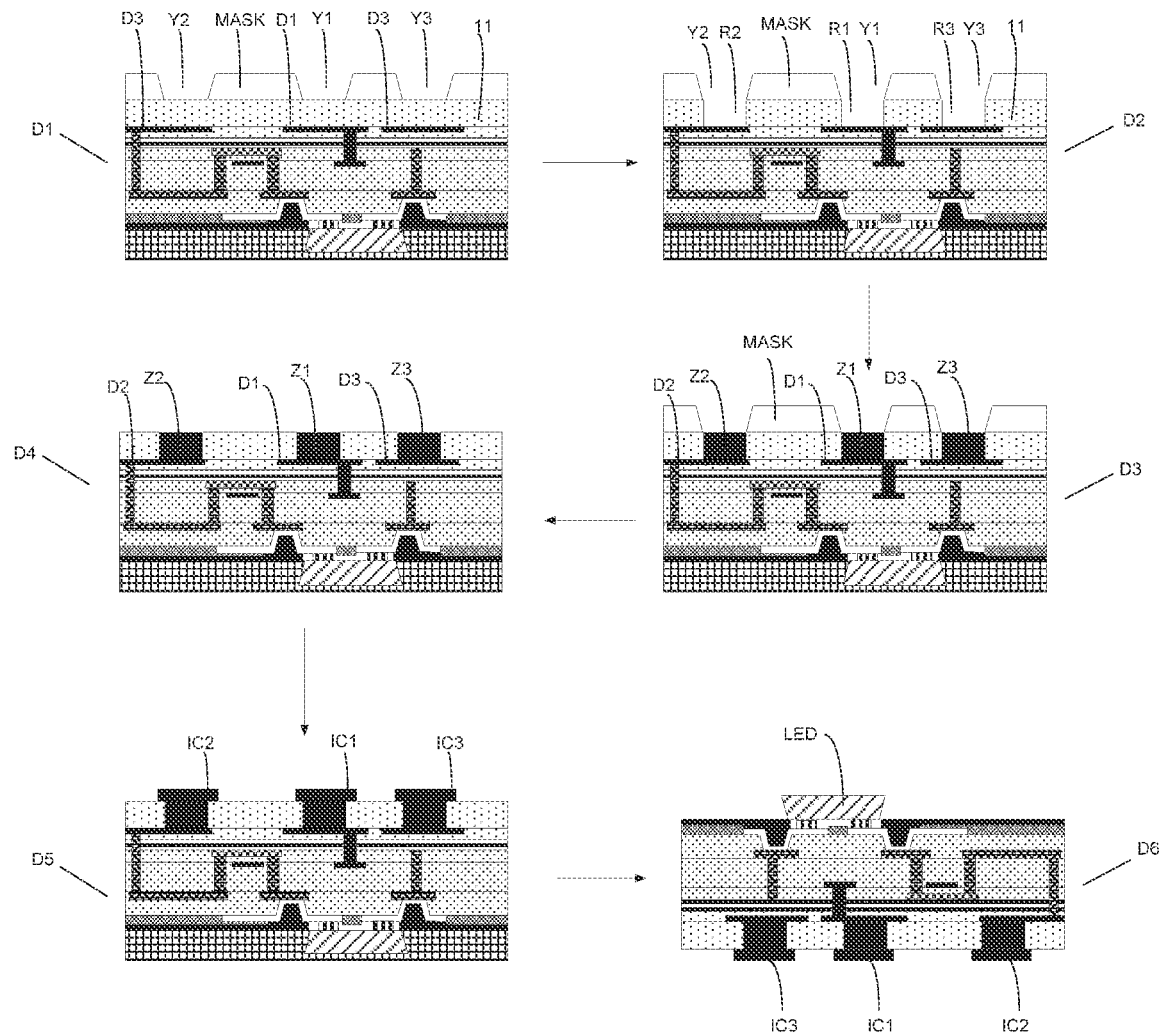
FIG. 8 is a diagram showing a process of yet another manufacturing method of a driving backplane, according to some embodiments of the present disclosure.

In S410, at least one type of first via is provided in the rigid substrate 01, for example, as shown in D1 in FIG. 8.

In this way, the rigid substrate 01 provided with the at least one type of first via can be used as a mask MASK.

Here, a type of the first via and the number of first vias for each type may be set to match the type and the number of the conductive patterns. For example, the first vias and the conductive patterns are arranged to be in one-to-one correspondence.

In S420, at least one type of second via is provided in the first flexible base 11 by using the rigid substrate 01 as a mask MASK, for example, as shown in D2 in FIG. 8.

In S430, conductive pillar(s) are formed in the at least one type of second via, so that the conductive pillar(s) formed in the at least one type of second via are connected to the at least one type of conductive pattern in one-to-one correspondence, for example, as shown in D3 in FIG. 8.

Since the mask MASK is essentially a rigid substrate 01 provided with at least one type of first via, the numbers and positions of the at least one type of second via formed with the mask MASK and the aforementioned at least one type of second via are in one-to-one correspondence.

The numbers of types of the aforementioned conductive patterns and the second via are in one-to-one correspondence, and an orthographic projection of each type of conductive pattern on a board surface where the first flexible base 11 is located at least coincides with an orthographic projection of an area occupied by a corresponding type of second via on the board surface where the first flexible base 11 is located. In this way, it may be possible to ensure that the conductive pillar(s) formed in each type of second via is connected to corresponding type(s) of conductive patterns in one-to-one correspondence.

As for a material of the conductive pillar, many conductive materials should suffice, such as metallic copper, metallic iron, or indium tin oxide. Of course, the better the conductivity of the material, the better the performance of the conductive pillar in transmitting driving signals.

In S610, at least one type of driving chip is correspondingly bonded to the conductive pillar(s) formed in the at least one type of second via from a side of the first flexible base 11 away from the at least one type of conductive pattern, for example, as shown in D5 in FIG. 8.

The at least one type of driving chip is located on a surface of the first flexible base 11 away from the at least one type of conductive pattern. In this case, each type of driving chip corresponds to one type of second via, and each type of second via is formed therein with a conductive pillar connected to a corresponding type of conductive pattern. In this way, each type of conductive pattern may be able to transmit one type of driving signal.

For example, the driving chip is a gate driving chip, which provides a gate signal, and uses a conductive pillar bonded thereto to transmit the gate signal to a corresponding type of conductive pattern, so that the conductive pattern transmits the gate signal.

For example, the driving chip is a data driving chip, which provides a data signal, and uses a conductive pillar bonded thereto to transmit the data signal to a corresponding type of conductive pattern, so that the conductive pattern transmits the data signal.

For example, the driving chip is a common signal driving chip, which provides a common signal (such as a common negative signal), and uses a conductive pillar bonded thereto to transmit the common signal to a corresponding type of conductive pattern, so that the conductive pattern transmits the common signal.

As can be seen from the manufacturing method of the driving backplane described above, after the at least one type of conductive pattern used for transmitting the driving signal is formed on the surface of the first flexible base 11 away from the rigid substrate 01, at least one type of first via is provided in the rigid substrate 01, so that the rigid substrate 01 can be used as a rigid mask MASK to mask the first flexible base 11, and at least one type of second via can be provided in the first flexible base 11 by using the rigid substrate 01 as the rigid mask MASK. In this way, there is no need to specially make a mask for the providing of vias in the first flexible base 11, and a total number of marks used in the manufacturing process of the driving backplane may be reduced.

Meanwhile, by forming the conductive pillar in each type of second via with the rigid substrate 01 serving as the rigid mask MASK, it may be possible to connect the conductive pillar(s) formed in each type of second via to the corresponding type of conductive pattern. In this way, the rigid substrate 01 serving as the rigid mask MASK can protect the first flexible base 11, so that no conductive materials residues will be formed on the surface of the first flexible base 11 during a process of forming the conductive pillars from the conductive material. Therefore, after the conductive pillars are formed in each type of second via, there is no need to polish the first flexible base 11 using a mechanical or chemical polishing process, which avoids damage to the first flexible base 11 by the mechanical or chemical polishing process.

It will be noted that the rigid mask MASK should be removed after the driving chip and the conductive pillar(s) are correspondingly bonded together. That is, as shown in FIGS. 1 and 8, with the masking of the rigid mask MASK, after the conductive pillar(s) are formed in each type of second via, and before the at least one type of driving chip and the conductive pillar(s) formed in the at least one type of second via are bonded together in one-to-one correspondence, the manufacturing method of the driving backplane further includes S510.

In S510, the rigid substrate 01 (that is, the rigid mask MASK) is removed from the first flexible base 11 to ensure that normal bonding of the driving chip, for example, as shown in D4 in FIG. 8.

In some embodiments, as shown in FIGS. 1, 5 and 6, after the at least one type of conductive pattern is formed on the surface of the first flexible base 11 away from the rigid substrate 01, and before the at least one type of first via is provided in the rigid substrate 01 to obtain the rigid mask MASK, the manufacturing method of the driving backplane further includes S230 and S240.

In S230, a second flexible base 12 is formed on the surface of the first flexible base 11 away from the rigid substrate 01, so that the at least one type of conductive pattern is located between the first flexible base 11 and the second flexible base 12, for example, as shown in B3 in FIG. 6.

In S240, a buffer layer 13 is formed on a surface of the second flexible base 12 away from the rigid substrate 01, for example, as shown in B4 in FIG. 6.

In this way, by using the second flexible base 12 and the buffer layer 13, it may be possible to increase a water and oxygen barrier performance of the driving backplane and thus improve a reliability of the driving backplane.

In some embodiments, there are various ways to provide the at least one type of first via in the rigid substrate 01, which are described below by way of example.

As shown in FIGS. 1 and 5, considering that the rigid substrate 01 is generally hard and brittle, it is difficult to make the vias. On this basis, before the first flexible base 11 is formed on the surface of the rigid substrate 01, the manufacturing method of the driving backplane further includes S120.

In S120, the rigid substrate 01 is modified so that the rigid substrate 01 includes at least one type of modified region, for example, as shown in A2 in FIG. 5.

Correspondingly, as shown in FIGS. 1 and 8, the providing of the at least one type of first via in the rigid substrate 01 includes that: the at least one type of first via is provided in the at least one type of modified region correspondingly, so that an orthographic projection of an area occupied by the at least one type of first via on the first flexible base is located within an orthographic projection of the at least one type of conductive pattern on the first flexible base in one-to-one correspondence (including a case where the two orthographic projections overlap). In this way, it may be possible to ensure that when the first flexible base 11 is masked by using the rigid mask MASK, the orthographic projection of an area occupied by the at least one type of second via formed in the first flexible base 11 is located within the orthographic projection of the at least one type of conductive pattern on the first flexible base 11 in one-to-one correspondence, for example, as shown in D1 in FIG. 8. Since the conductive copper pillar is formed in each type of second via, the conductive copper pillar formed in each type of second via can be connected to a corresponding type of conductive pattern in a case where the orthographic projection of the area occupied by the at least one type of second via on the first flexible base 11 is located within the orthographic projection of the at least one type of conductive pattern on the first flexible base 11 in one-to-one correspondence.

For example, the rigid substrate 01 is a glass substrate, and the modifying of the rigid substrate 01 includes that: the glass substrate is modified by a method of laser irradiation, so that the glass substrate includes at least one type of modified region.

The modified region is more easily corroded by hydrofluoric acid than an unmodified region of the glass substrate. Therefore, by using hydrofluoric acid to corrode the at least one type of modified region, it may be possible to provide the at least one type of first via in the at least one type of modified region in one-to-one correspondence, so that the orthographic projection of the area occupied by the at least one type of first via on the first flexible base 11 is located within the orthographic projection of the at least one type of conductive pattern on the first flexible base 11 in one-to-one correspondence.

Figure 7:
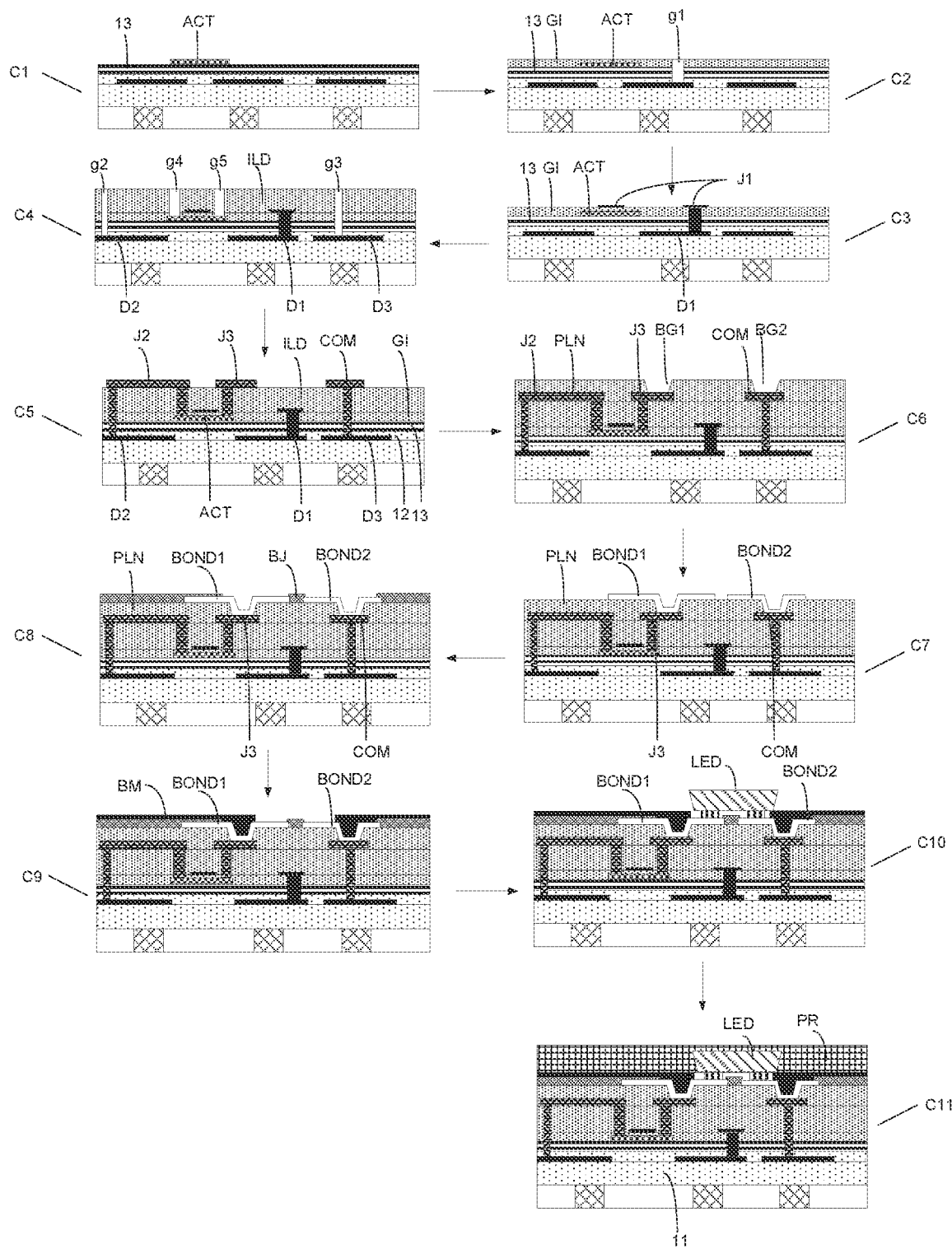
FIG. 7 is a diagram showing a process of yet another manufacturing method of a driving backplane, according to some embodiments of the present disclosure.

In some embodiments, as shown in FIGS. 1, 7 and 8, considering a continuity of a film forming process, after the at least one type of conductive pattern is formed on the surface of the first flexible base 11 away from the rigid substrate 01, and before the at least one type of first via is provided in the rigid substrate 01, the manufacturing method of the driving backplane further includes S310.

In S310, a thin film transistor (TFT) array and a light emitting device (LED) array are formed on a side of the first flexible base 11 away from the rigid substrate 01, for example, as shown in D1 in FIG. 8.

In a case where the second flexible base 12 and the buffer layer 13 are sequentially stacked on the surface of the first flexible base 11 away from the rigid substrate 01, the TFT array and the LED array are stacked on a surface of the buffer layer 13 away from the rigid substrate 01 in a direction away from the buffer layer 13.

As shown in FIGS. 5 to 8, the TFT array includes three types of electrodes, namely, a first type of electrode J1, a second type of electrode J2, and a third type of electrode J3. Optionally, the first type of electrode J1 is a gate, the second type of electrode J2 is a source, and the third type of electrode J3 is a drain; or, the first type of electrode J1 is a gate, the second type of electrode J2 is a drain, and the third type of electrode J3 is a source.

When the TFT array correspondingly drives the LED array to emit light, there is a need to load a gate signal to the first type of electrode J1, load a data signal to the second type of electrode J2, and load a common signal to the LED array, so that the LED array can be driven to emit light. Therefore, the driving chip includes three types of driving chips, namely, a gate driving chip IC1, a data driving chip IC2, and a common signal driving chip IC3. The conductive pattern includes three types of conductive patterns, namely, a first type of conductive pattern D1, a second type of conductive pattern D2 and a third type of conductive pattern D3. The first via includes three types of first vias, namely, a first type of first via Y1, a second type of first via Y2, and a third type of first via Y3. Correspondingly, the modified region includes three types of modified regions, namely, a first type of modified region GX1, a second type of modified region GX2, and a third type of modified region GX3. The second via includes three types of second vias, namely, a first type of second via R1, a second type of second via R2, and a third type of second via R3. A conductive pillar formed in the first type of second via R1 is defined as a first type of conductive pillar Z1, a conductive pillar formed in the second type of second via R2 is defined as a second type of conductive pillar Z2, and a conductive pillar formed in the third type of second via R3 is defined as a third type of conductive pillar Z3.

It will be noted that an orthographic projection of an area occupied by the first type of first via Y1 on the board surface where the first flexible base 11 is located coincides with an orthographic projection of the first type of modified region GX1 on the board surface where the first flexible base 11 is located. An orthographic projection of an area occupied by the first type of second via R1 on the board surface where the first flexible base 11 is located should be located within the orthographic projection of the area occupied by the first type of first via Y1 on the board surface where the first flexible base 11 is located. The orthographic projection of the area occupied by the first type of second via R1 on the board surface where the first flexible base 11 is located is within an orthographic projection of the first type of conductive pattern D1 on the board surface where the first flexible base 11 is located. Similarly, an orthographic projection of the area occupied by the second type of first via Y2 on the board surface where the second flexible base 12 is located coincides with an orthographic projection of the second type of modified region GX2 on the board surface where the second flexible base 12 is located. An orthographic projection of the area occupied by the second type of second via R2 on the board surface where the first flexible base 11 is located should be within the orthographic projection of the second type of the area occupied by first via Y2 on the board surface where the first flexible base 11 is located. The orthographic projection of the area occupied by the second type of second via R2 on the board surface where the first flexible base 11 is located is located within the orthographic projection of the second type of conductive pattern D2 on the board surface where the first flexible base 11 is located. An orthographic projection of an area occupied by the third type of first via Y3 on the board surface where the first flexible base 11 is located coincides with an orthographic projection of the third type of modified region GX3 on the board surface where the first flexible base 11 is located. An orthographic projection of the area occupied by the third type of second via R3 on the board surface where the first flexible base 11 is located should be located within the orthographic projection of the area occupied by the third type of first via Y3 on the board surface where the first flexible base 11 is located. The orthographic projection of the area occupied by the third type of second via R3 on the board surface where the first flexible base 11 is located is located within an orthographic projection of the third type of conductive pattern D3 on the board surface where the first flexible base 11 is located.

Specifically, as shown in FIGS. 2, 3 and 5 to 8, the forming of the TFT array and the LED array on the side of the first flexible base 11 away from the rigid substrate 01 includes S311 and S316.

In S311, a TFT array and a common lead COM are formed on a side of the first flexible base 11 away from the rigid substrate 01, so that the first type of electrode J1 included in the TFT array is connected to the first type of conductive pattern D1, the second type of electrode J2 is connected to the second type of conductive pattern D2, and the common lead COM is connected to the third type of conductive pattern D3, for example, as shown in C1-C5 in FIG. 7. The third type of conductive pattern D3 can be connected to the common signal driving chip through the third type of conductive pillar Z3, so as to transmit common signals.

In S316, a LED array is formed on a side of the TFT array away from the rigid substrate 01, so that the common electrode included in the LED array is connected to the common lead COM, and a driving electrode included in the LED array is connected to the third type of electrode J3 included in the TFT array, for example, as shown in C10 in FIG. 7.

The driving electrode included in the LED array is connected to the third type of electrode J3 included in the TFT array, so as to ensure that the TFT array correspondingly drives the LED array to emit light.

It will be understood that a planarization layer PLN is generally provided between the TFT array and the LED array, so that the LED array is formed on a relatively flat surface. For example, a second electrode and a third electrode included in the TFT array are usually located on the surface of the TFT array away from the first flexible base 11, as shown in FIGS. 2 and 5 to 8. Correspondingly, after the TFT array and the common lead COM are formed on the side of the first flexible base 11 away from the rigid substrate 01, and before the LED array is formed on the side of the TFT array away from the rigid substrate 01, the manufacturing method of the driving backplane further includes S312~S315 between S311 and S316.

In S312, a planarization layer PLN is formed on a surface of the TFT array away from the rigid substrate 01, so that the planarization layer PLN is located on surfaces of the second type of electrode J2 and the third type of electrode J3 away from the rigid substrate 01, for example, as shown in C6 in FIG. 7.

Herein, the second type of electrode J2 is the source, and the third type of electrode J3 is the drain; or, the second type of electrode J2 is the drain, and the third type of electrode J3 is the source.

In S313, a first type of bonding via BG1 and a second type of bonding via BG2 are provided in the planarization layer PLN, so that an orthographic projection of an area occupied by the first type of bonding via BG1 on the board surface where the first flexible base 11 is located is located within an orthographic projection of the third type of electrode J3 on the board surface where the first flexible base 11 is located, and an orthographic projection of the area occupied by the second type of bonding via BG2 on the board surface where the first flexible base 11 is located is located within the orthographic projection of the common lead COM on the board surface where the first flexible base 11 is located, for example, as shown in C6 in FIG. 7. In this way, it may be possible to ensure that the TFT array drives the LED array.

In S314, a first type of bonding layer BOND1 and a second type of bonding layer BOND2 that are insulated from each other are formed on a surface of the planarization layer PLN away from the rigid substrate 01, so that the first type of bonding layer BOND1 is electrically connected to the third type of electrode J3, and the second type of bonding layer BOND2 is electrically connected to the common lead COM, for example, as shown in C7 in FIG. 7.

The electrically connection between the first type of bonding layer BOND1 and the third type of electrode J3 may be realized through the first type of bonding via BG1 provided in the planarization layer PLN, and the electrically connection between the second type of bonding layer BOND2 and the common lead COM may be realized through the second type of bonding via BG2 provided in the planarization layer PLN.

For example, as shown in FIGS. 3 to 8, the forming of the first type of bonding layer BOND1 and the second type of bonding layer BOND2 that are insulated from each other on the surface of the planarization layer PLN away from the rigid substrate 01 includes S31411~S31413.

In S31411, a bonding forming layer is formed on the surface of the planarization layer PLN away from the rigid substrate 01.

Herein, the bonding forming layer may be formed on the surface of the planarization layer PLN away from the rigid substrate 01 by using a magnetron sputtering process or the like.

In S31412, the bonding forming layer is patterned to obtain the first type of bonding layer BOND1 and the second type of bonding layer BOND2, so that there is an insulating gap between the first type of bonding layer BOND1 and the second type of bonding layer BOND2, for example, as shown in C7 in FIG. 7.

In this way, the first type of bonding layer BOND1 and the second type of bonding layer BOND2 can be insulated from each other.

As for a manner of patterning the bonding forming layer, an exposure and development method or a conventional etching method may be adopted.

In S31413, a bonding insulating layer BJ is formed at least in the insulating gap, so that the first type of bonding layer BOND1 and the second type of bonding layer BOND2 are insulated from each other.

Of course, the bonding insulating layer BJ may also be formed at other positions as shown in C8 in FIG. 7.

In S315, a black matrix BM is formed in at least a region of the first type of bonding layer BOND1 corresponding to the first type of bonding via BG1 and a region of the second type of bonding layer BOND2 corresponding to the second type of bonding via BG2, so that an electrical connection between the first type of bonding layer BOND1 and the third type of electrode J3 is more reliable under an action of the black matrix BM, and an electrical connection between the second type of bonding layer BOND2 and the common lead COM is more reliable under the action of the black matrix BM.

Of course, the black matrix BM also has a function of defining a pixel, which will not be elaborated here.

Of course, the black matrix BM may also be formed in other positions as shown in C9 in FIG. 7.

In this case, the forming of the LED array on the side of the TFT array away from the rigid substrate 01 includes that: the LED array is arranged on the surfaces of the first type of bonding layer BOND1 and the second type of bonding layer BOND2 away from the rigid substrate 01, so that the first type of bonding layer BOND1 is connected to the driving electrode, and the second type of bonding layer BOND2 is connected to the common electrode, for example, as shown in C10 in FIG. 7.

In the TFT array described above, film structures of the first type of electrode J1, the second type of electrode J2, and the third type of electrode J3 are related to a type of a corresponding TFT.

Optionally, TFTs in the TFT array are all top-gate TFTs.

As shown in FIGS. 3 to 8, the second flexible base 12 is formed on the surface of the first flexible base 11 away from the rigid substrate 01, and a buffer layer 13 is formed on the surface of the second flexible base 12 away from the rigid substrate 01. The first type of electrode J1 is a gate, the second type of electrode J2 is a source, and the third type of electrode J3 is a drain.

The forming of the TFT array and the LED array on the side of the first flexible base 11 away from the rigid substrate 01 includes S3111~S3161.

In S3111, an active layer ACT is formed on a surface of the buffer layer 13 away from the rigid substrate 01, as shown in C1 in FIG. 7.

In S3112, a gate insulating layer GI covering the buffer layer 13 is formed on a surface of the active layer ACT away from the rigid substrate 01, and then a first type of through hole g1 penetrating the gate insulating layer GI, the buffer layer 13, and the second flexible base 12 is formed, so that an orthographic projection of an area occupied by the first type of through hole g1 on the board surface where the first flexible base 11 is located is located within an orthographic projection of a corresponding first type of conductive pattern D1 on the board surface where the first flexible base 11 is located, for example, as shown in C2 in FIG. 7.

In S3113, a gate layer (that is, the first type of electrode J1) is formed on a surface of the gate insulating layer GI away from the rigid substrate 01, and the gate layer may be connected to the first type of conductive pattern D1 through the first type of through hole g1. In this case, the first type of conductive pattern D1 is electrically connected to the gate driving chip IC1 through the first type of conductive pillar Z1 for transmitting gate signals, for example, as shown in C3 in FIG. 7.

In S3114, an interlayer dielectric layer ILD covering the gate layer and the gate insulating layer GI is formed on a surface of the gate layer away from the rigid substrate 01. Then, a second type of through hole g2 and a third type of through hole g3 penetrating the interlayer dielectric layer ILD, the gate insulating layer GI, the buffer layer 13, and the second flexible base 12 are formed, and a fourth type through hole g4 and a fifth type through hole g5 penetrating the interlayer dielectric layer ILD and the gate insulating layer GI are formed. An orthographic projection of an area occupied by the second type of through hole g2 on the board surface where the first flexible base 11 is located is located within an orthographic projection of the second type of conductive pattern D2 on the board surface where the first flexible base 11 is located. An orthographic projection of an area occupied by the third type of through hole g3 on the board surface where the first flexible base 11 is located is located within an orthographic projection of the third type of conductive pattern D3 on the board surface where the first flexible base 11 is located. An orthographic projections of an area occupied by the fourth type through hole g4 and the fifth type through hole g5 on the board surface where the first flexible base 11 is located are located within an orthographic projection of the active layer ACT on the board surface where the first flexible base 11 is located. For example, it is as shown in C4 in FIG. 7.

In S3115, the source (the second type of electrode J2), the drain (the third type of electrode J3) and the common lead COM are formed on a surface of the interlayer dielectric layer ILD away from the rigid substrate 01, so that the source is electrically connected to a corresponding second type of conductive pattern D2 through the second type of through hole g2, the common lead COM is electrically connected to a corresponding third type of conductive pattern D3 through the third type of through hole g3, the source is electrically connected to a corresponding active layer ACT through the fourth type of through hole g4, and the drain is electrically connected to a corresponding active layer ACT through the fifth type of through hole g5. For example, it is as shown in C5 in FIG. 7.

At this point, a fabrication of the TFT array is completed.

The second type of conductive pattern D2 is electrically connected to the data driving chip IC2 through the second type of conductive pillar Z2 for transmitting the data signals.

In S3121, the planarization layer PLN is formed on the surface of the TFT array away from the rigid substrate 01, so that the planarization layer PLN is located on the surfaces of the source and the drain away from the rigid substrate 01, for example, as shown in C6 in FIG. 7.

In S3131, a first type of bonding via BG1 and a second type of bonding via BG2 are provided in the planarization layer PLN, so that the orthographic projection of the area occupied by the first type of bonding via BG1 on the board surface where the first flexible base 11 is located is located within the orthographic projection of the drain on the board surface where the first flexible base 11 is located, and the orthographic projection of the area occupied by the second type of bonding via BG2 on the board surface where the first flexible base 11 is located is located within the orthographic projection of the common lead COM on the board surface where first flexible base 11 is located, for example, as shown in C6 in FIG. 7.

In S3141, the first type of bonding layer BOND1 and the second type of bonding layer BOND2 that are insulated from each other are formed on a surface of the planarization layer PLN away from the rigid substrate 01, so that the first type of bonding layer BOND1 is electrically connected to the third type of electrode J3, and the second type of bonding layer BOND2 is electrically connected to the common lead COM, for example, as shown in C7 in FIG. 7.

The electrically connection between the first type of bonding layer BOND1 and the drain can be realized through the first type of bonding via BG1 provided in the planarization layer PLN, and the electrically connection between the second type of bonding layer BOND2 and the common lead COM can be realized through the second type of bonding via BG2 provided in the planarization layer PLN.

In S3151, a black matrix BM is formed at least in a region of the first type of bonding layer BOND1 corresponding to the first type of bonding via BG1 and a region of the second type of bonding layer BOND2 corresponding to the second type of bonding via BG2, so that the electrical connection between the first type of bonding layer BOND1 and the drain is more reliable under an action of the black matrix BM, and an electrical connection between the second type of bonding layer and the common lead COM is more reliable under the action of the black matrix BM.

Of course, the black matrix BM may also be formed in other positions as shown in C9 in FIG. 7.

In S3161, the LED array is formed on the surfaces of the first type of bonding layer BOND1 and the second type of bonding layer BOND2 away from the rigid substrate 01, so that the first type of bonding layer BOND1 is connected to the driving electrode, and the second type of bonding layer BOND2 is connected to the common electrode, for example, as shown in C10 in FIG. 7.

At this point, a fabrication of the LED array is completed.

In some embodiments, as shown in FIGS. 1, 5 and 7, after the LED array is formed on the side of the TFT array away from the rigid substrate 01, and before the at least one type of first via is provided in the rigid substrate 01, the manufacturing method of the driving backplane further includes S320.

In S320, a backplane protective layer PR is formed on a surface of the LED array away from the rigid substrate 01, for example, as shown in C11 in FIG. 7. In this way, it may be possible to avoid a damage to the LED array and the TFT array caused by a process of providing the at least one type of first via when the at least one type of first via is being provided in the rigid substrate 01.

Correspondingly, as shown in FIGS. 1 and 8, after the at least one type of driving chip and the at least one type of conductive pillar formed in the second vias are bonded together in one-to-one correspondence, the manufacturing method of the driving backplane further includes S710.

In S710, the backplane protective layer PR is removed from the surface of the LED array away from the rigid substrate 01, for example, as shown in D6 in FIG. 8.

Figure 9:
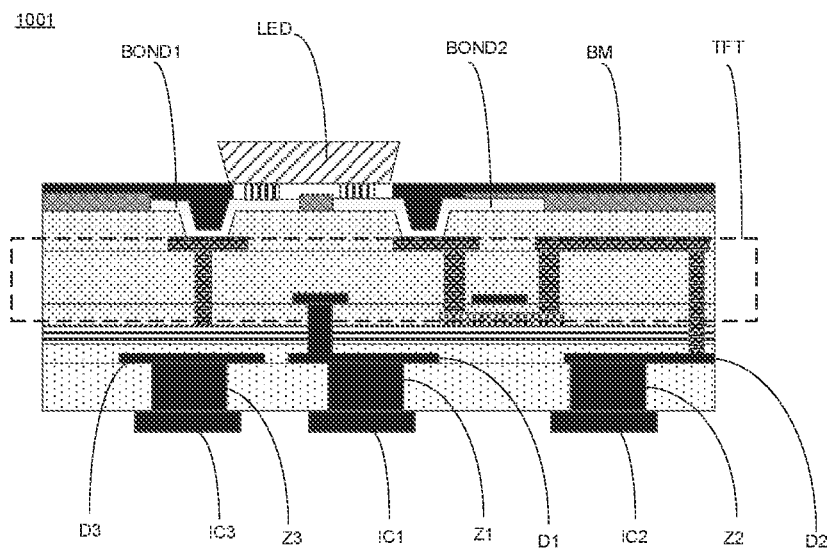
FIG. 9 is a diagram showing a structure of a driving backplane, according to some embodiments of the present disclosure.

As shown in FIG. 9, some embodiments of the present disclosure further provide a driving backplane 1001. The driving backplane is manufactured by the manufacturing method of the driving backplane described in some of the above embodiments. As for a structure of the driving backplane 1001, reference may be made to related descriptions in some of the above embodiments, and details will be repeated here.

Beneficial effects of the driving backplane provided by the embodiments of the present disclosure are the same as those of the manufacturing method of the driving backplane described above, and details will not be repeated here.

Figure 10:
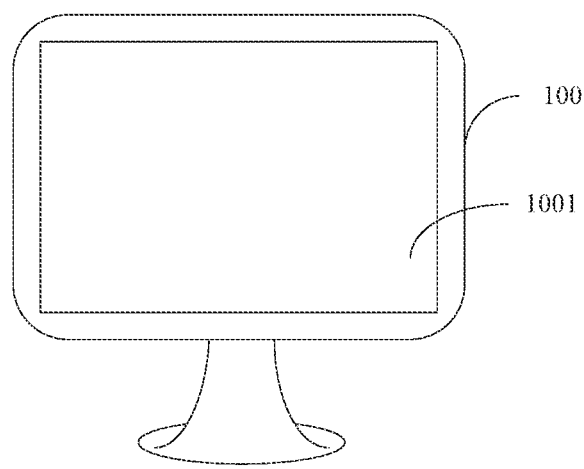
FIG. 10 is a diagram showing a structure of a display apparatus, according to some embodiments of the present disclosure.

As shown in FIG. 10, some embodiments of the present disclosure further provide a display apparatus 100. The display apparatus includes the driving backplane 1001 as described above. Beneficial effects of the display apparatus provided by the embodiments of the present disclosure are the same as those of the driving backplane described above, and details will not be repeated here.

Optionally, the display apparatus provided in the above embodiments is a mobile phone, a tablet computer, a television, a display, a notebook computer, a digital photo frame, a navigator, or any other product or component having a display function.

In the description of the above embodiments, specific features, structures, materials, or characteristics may be combined in any suitable manner in any one or more embodiments or examples.

The foregoing descriptions are merely specific implementations of the present disclosure, but the protection scope of the present disclosure is not limited thereto. Any person skilled in the art could readily conceive of changes or replacements within the technical scope of the present disclosure, which shall all be included in the protection scope of the present disclosure. Therefore, the protection scope of the present disclosure shall be subject to the protection scope of the claims.

What is claimed is:

1. A manufacturing method of a driving backplane, comprising:
    providing a rigid substrate;
    forming a first flexible base on a surface of the rigid substrate;
    forming at least one type of conductive pattern on a surface of the first flexible base away from the rigid substrate, the at least one type of conductive pattern being configured to transmit a driving signal;
    providing at least one type of first via in the rigid substrate;
    providing at least one type of second via in the first flexible base by using the rigid substrate as a mask, and forming a conductive pillar in the at least one type of second via, so that the conductive pillar formed in the at least one type of second via is connected to the at least one type of conductive pattern in one-to-one correspondence; and bonding at least one type of driving chip to the conductive pillar formed in the at least one type of second via correspondingly from a side of the first flexible base away from the at least one type of conductive pattern.

2. The manufacturing method of the driving backplane according to claim 1, wherein after forming the conductive pillar in the at least one type of second via, and before bonding the at least one type of driving chip to the conductive pillar formed in the at least one type of second via correspondingly, the manufacturing method of the driving backplane further comprises:
removing the rigid substrate from the first flexible base.

3. The manufacturing method of the driving backplane according to claim 1, wherein
before forming the first flexible base on the surface of the rigid substrate, the manufacturing method of the driving backplane further comprises:
modifying the rigid substrate so that the rigid substrate includes at least one type of modified region; and
providing the at least one type of first via in the rigid substrate includes:
providing the at least one type of first via in the at least one type of modified region correspondingly, so that an orthographic projection of an area occupied by the at least one type of first via on the first flexible base is located within an orthographic projection of the at least one type of conductive pattern on the first flexible base in one-to-one correspondence.

4. The manufacturing method of the driving backplane according to claim 1, wherein the at least one type of conductive pattern includes a first type of conductive pattern, a second type of conductive pattern, and a third type of conductive pattern; and
after forming the at least one type of conductive pattern on the surface of the first flexible base away from the rigid substrate, and before providing the at least one type of first via in the rigid substrate, the manufacturing method of the driving backplane further comprises:
forming a thin film transistor (TFT) array and a common lead on a side of the first flexible base away from the rigid substrate, so that a first type of electrode included in the TFT array is correspondingly connected to the first type of conductive pattern, a second type of electrode included in the TFT array is correspondingly connected to the second type of conductive pattern, and the common lead is correspondingly connected to the third type of conductive pattern; and
forming a light emitting device (LED) array on a side of the TFT array away from the rigid substrate, so that a common electrode included in the LED array is connected to the common lead, and a driving electrode included in the LED array is connected to a third type of electrode included in the TFT array.

5. The manufacturing method of the driving backplane according to claim 4, wherein after forming the LED array on the side of the TFT away from the rigid substrate, and before providing the at least one type of first via in the rigid substrate, the manufacturing method of the driving backplane further comprises:
forming a backplane protective layer on a surface of the LED array away from the rigid substrate; and
after bonding the at least one type of driving chip to the conductive pillar formed in the at least one type of second via correspondingly, the manufacturing method of the driving backplane further comprises:
removing the backplane protective layer from the surface of the LED array away from the rigid substrate.

6. The manufacturing method of the driving backplane according to claim 4, wherein
after forming the TFT array and the common lead on the surface of the first flexible base, and before forming the LED array on the side of the TFT array away from the rigid substrate, the manufacturing method of the driving backplane further comprises:
forming a planarization layer on a surface of the TFT array away from the rigid substrate, so that the planarization layer is located on surfaces of the second type of electrode and the third type of electrode away from the rigid substrate; and
forming a first type of bonding layer and a second type of bonding layer that are insulated from each other on a surface of the planarization layer away from the rigid substrate, so that the first type of bonding layer is electrically connected to the third type of electrode, and the second type of bonding layer is electrically connected to the common lead; and
forming the LED array on the side of the TFT array away from the rigid substrate includes:
forming the LED array on surfaces of the first type of bonding layer and the second type of bonding layer away from the rigid substrate, so that the first type of bonding layer is connected to the driving electrode, and the second type of bonding layer is connected to the common electrode.

7. The manufacturing method of the driving backplane according to claim 6, wherein
forming the first type of bonding layer and the second type of bonding layer that are insulated from each other on the surface of the planarization layer away from the rigid substrate includes:
forming a bonding forming layer on the surface of the planarization layer away from the rigid substrate;
patterning the bonding forming layer to obtain the first type of bonding layer and the second type of bonding layer, with an insulating gap between the first type of bonding layer and the second type of bonding layer; and
forming a bonding insulating layer at least in the insulating gap, so that the first type of bonding layer and the second type of bonding layer are insulated from each other.

8. The manufacturing method of the driving backplane according to claim 1, wherein after forming the at least one type of conductive pattern on the surface of the first flexible base away from the rigid substrate, and before providing the at least one type of first via in the rigid substrate, the manufacturing method of the driving backplane further comprises:
forming a second flexible base on the surface of the first flexible base away from the rigid substrate, so that the at least one type of conductive pattern is located between the first flexible base and the second flexible base; and
forming a buffer layer on a surface of the second flexible base away from the rigid substrate.

9. The manufacturing method of the driving backplane according to claim 4, wherein
the first type of electrode is a gate, the second type of electrode is a source, and the third type of electrode is a drain; or,
the first type of electrode is a gate, the second type of electrode is a drain, and the third type of electrode is a source.

10. A driving backplane, manufactured by using the manufacturing method of the driving backplane according to claim 1.

11. A display apparatus, comprising the driving backplane according to claim 10.

* * * * *